United States Patent
Zheng (10) Patent No.: US 12,176,233 B2
(45) Date of Patent: Dec. 24, 2024

(54) APPARATUS AND METHOD FOR TRANSFERRING WAFER, AND APPARATUS FOR CONTROLLING TRANSFERRING WAFER

(71) Applicant: CHANGXIN MEMORY TECHNOLOGIES, INC., Hefei (CN)

(72) Inventor: Fencheng Zheng, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 430 days.

(21) Appl. No.: 17/648,452

(22) Filed: Jan. 20, 2022

(65) Prior Publication Data

US 2023/0054858 A1 Feb. 23, 2023

Related U.S. Application Data

(63) Continuation of application No. PCT/CN2021/116879, filed on Sep. 7, 2021.

(30) Foreign Application Priority Data

Aug. 17, 2021 (CN) .......................... 202110943242.4

(51) Int. Cl.
*H01L 21/68* (2006.01)
*H01L 21/67* (2006.01)
(Continued)

(52) U.S. Cl.
CPC ........ *H01L 21/68* (2013.01); *H01L 21/67167* (2013.01); *H01L 21/67748* (2013.01); *H01L 21/68707* (2013.01)

(58) Field of Classification Search
CPC ............... H01L 21/68; H01L 21/67167; H01L 21/67748; H01L 21/68707;
(Continued)

(56) References Cited

U.S. PATENT DOCUMENTS 6,040,585 A 3/2000 Hsiao
6,113,165 A 9/2000 Wen et al.
(Continued)

FOREIGN PATENT DOCUMENTS

| CN | 101360988 B | * | 1/2016 | ......... G01N 21/9501 |
| CN | 102456601 B | | 1/2016 | |

(Continued)

OTHER PUBLICATIONS

International Search Report cited in PCT/CN2021/116879 mailed May 13, 2022, 9 pages.

*Primary Examiner* — Thomas C Lee
*Assistant Examiner* — Michael Tang
(74) *Attorney, Agent, or Firm* — Syncoda LLC; Feng Ma (57) ABSTRACT

The present disclosure provides an apparatus and a method for transferring a wafer, and an apparatus for controlling transferring a wafer. The apparatus for transferring a wafer includes a transfer chamber, at least one process chamber, a first detection unit, and a control unit, wherein the transfer chamber is provided therein with a transfer unit; the at least one process chamber is in connect with the transfer chamber, and a chamber door is provided at a connect position; the first detection unit includes a first transmit end and a first receive end, the first transmit end is provided on one of the transfer unit and the chamber door, and the first transmit end is provided on the other one of the transfer unit and the chamber door.

6 Claims, 5 Drawing Sheets

(51) Int. Cl.
*H01L 21/677* (2006.01)
*H01L 21/687* (2006.01)

(58) Field of Classification Search
CPC ......... H01L 21/67265; H01L 21/67754; H01L 21/67742
USPC .................................. 700/218; 414/936, 222
See application file for complete search history.

(56) References Cited

U.S. PATENT DOCUMENTS

| | | | |
|---|---|---|---|
| 6,546,307 | B1 | 4/2003 | Hsiao |
| 9,030,656 | B2 | 5/2015 | Kajiwara et al. |
| 2001/0051088 | A1* | 12/2001 | Park ................. H01L 21/67265 |
| | | | 414/416.03 |
| 2003/0017042 | A1* | 1/2003 | Hsiao ..................... B25B 5/147 |
| | | | 414/744.5 |
| 2005/0194096 | A1* | 9/2005 | Price ................. H01L 21/67161 |
| | | | 156/345.31 |
| 2007/0189596 | A1 | 8/2007 | Lee et al. |
| 2008/0124200 | A1* | 5/2008 | Lee ................... H01L 21/68742 |
| | | | 414/217.1 |
| 2015/0147148 | A1* | 5/2015 | Coady ............... H01L 21/68707 |
| | | | 414/744.2 |
| 2015/0303083 | A1* | 10/2015 | Wakabayashi .... H01L 21/67259 |
| | | | 414/806 |
| 2020/0020558 | A1* | 1/2020 | Liao .................. H01L 21/67766 |
| 2023/0057774 | A1* | 2/2023 | Liang .................... G03F 7/7075 |
| 2023/0258023 | A1* | 8/2023 | Fie .......................... E05B 65/00 |
| | | | 701/23 |

FOREIGN PATENT DOCUMENTS

| | | |
|---|---|---|
| CN | 110164787 A | 8/2019 |
| CN | 110648940 A | 1/2020 |
| CN | 112242313 A | 1/2021 |

\* cited by examiner

APPARATUS AND METHOD FOR TRANSFERRING WAFER, AND APPARATUS FOR CONTROLLING TRANSFERRING WAFER

CROSS-REFERENCE TO RELATED APPLICATIONS

This is a continuation of International Application No. PCT/CN2021/116879, filed on Sep. 7, 2021, which claims the priority to Chinese Patent Application 202110943242.4, titled "APPARATUS AND METHOD FOR TRANSFERRING WAFER, AND APPARATUS FOR CONTROLLING TRANSFERRING WAFER" and filed on Aug. 17, 2021. The entire contents of International Application No. PCT/CN2021/116879 and Chinese Patent Application 202110943242.4 are incorporated herein by reference.

TECHNICAL FIELD

The present disclosure relates to, but is not limited to, an apparatus and a method for transferring a wafer, and an apparatus for controlling transferring a wafer.

BACKGROUND

In a production process, a wafer in a semiconductor structure needs to be transferred between a transfer chamber and each process chamber, wherein a chamber door that can be closed or opened is provided between the transfer chamber and the process chamber.

In a wafer transfer process, a wafer transfer position may shift, and an increasing large position shift error causes wafer damage when the wafer touches the chamber door, resulting in a relatively high product defect rate.

SUMMARY

An overview of the subject matter detailed in the present disclosure is provided below, which is not intended to limit the protection scope of the claims.

The present disclosure provides an apparatus and a method for transferring a wafer, and an apparatus for controlling transferring a wafer.

A first aspect of embodiments of the present disclosure provides an apparatus for transferring a wafer, including:
  a transfer chamber, the transfer chamber being provided therein with a transfer unit configured to transfer a wafer;
  at least one process chamber, configured for process processing of the wafer, the at least one process chamber being in connect with the transfer chamber, and a chamber door being provided at a connect position;
  a first detection unit, configured to detect position information between the transfer unit and the chamber door, and the first detection unit including a first transmit end and a first receive end, wherein the first transmit end is provided on one of the transfer unit and the chamber door, and the first receive end is provided on the other one of the transfer unit and the chamber door; and
  a control unit, electrically connected to the first detection unit, the transfer unit, and the chamber door separately, the control unit being configured to determine the position information between the transfer unit and the chamber door, control the transfer unit to move, and control the chamber door to open or close.

A second aspect of the embodiments of the present disclosure provides a method for transferring a wafer, applied in a process of transferring a wafer between a process chamber and a transfer chamber by an apparatus for transferring a wafer, including:
  obtaining position information between a transfer unit and a chamber door of the apparatus for transferring a wafer; and
  obtaining preset position information, the preset position information being used to represent a position where the transfer unit will transfer the wafer without interfering with the process chamber; and
  controlling the chamber door to open when the position information is consistent with the preset position information.

A third aspect of the embodiments of the present disclosure provides an apparatus for controlling transferring a wafer, applied in a process of transferring a wafer between a process chamber and a transfer chamber by an apparatus for transferring a wafer, including:
  an obtaining module, configured to obtain position information between a transfer unit and a chamber door;
  the obtaining module being further configured to obtain preset position information, the preset position information being used to represent a position where the transfer unit will transfer the wafer without interfering with the process chamber;
  a processing module, configured to determine whether the position information is consistent with the preset position information; and
  a control module, configured to control the chamber door to open when the position information is consistent with the preset position information.

Other aspects of the present disclosure are understandable upon reading and understanding of the accompanying drawings and detailed description.

BRIEF DESCRIPTION OF THE DRAWINGS

To describe the technical solutions in the embodiments of the present disclosure or in the prior art more clearly, the following briefly describes the accompanying drawings required for describing the embodiments or the prior art. Apparently, the accompanying drawings in the following description show some embodiments of the present disclosure, and a person of ordinary skill in the art may still derive other drawings from these accompanying drawings without creative efforts.

REFERENCE NUMERALS

1. Transfer chamber;
2. Process chamber;
3. First detection unit;
4. Control unit;
5. Wafer;
6. Transfer unit;
7. Chamber door;
8. Second detection unit;
31. First transmit end;
32. First receive end;
61. Carrier portion;
62. Transfer component;
100. Obtaining module;
200. Processing module;
300. Control module;
611. Carrier body;
612. Carrying rod.

DETAILED DESCRIPTION

To make the objectives, technical solutions, and advantages of the embodiments of the present disclosure clearer, the following clearly and completely describes the technical solutions in the embodiments of the present disclosure with reference to the accompanying drawings in the embodiments of the present disclosure. Apparently, the described embodiments are some but not all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

In a production process of a wafer in a semiconductor structure, a mechanical arm can be used to complete the transfer of the wafer between a transfer chamber and a process chamber. There is a chamber door that can be closed or opened between the transfer chamber and the process chamber. The mechanical arm needs to be calibrated during use, but the degree of calibration by an operator varies to a particular extent each time. Moreover, as the mechanical arm ages, there are cumulative errors in a wafer grabbing process of the mechanical arm, which causes the wafer to shift in a transfer process and causes the wafer to touch the chamber door, resulting in damage. Consequently, a product yield is reduced.

In addition, when corresponding process processing is performed on the wafer in the process chamber, because forces of the mechanical arm to clamp the wafer in the process chamber are different, or the airflow, gas pressure, and the like used to process the wafer in the process processing process acts on the wafer, it is easy to cause the wafer to shift in a production process, resulting in the mechanical arm not being able to accurately grab the wafer. Even if the mechanical arm grabs the wafer in the process chamber, only when the mechanical arm returns to the transfer chamber does it show that the wafer has shifted and a machine platform issues an alarm, and a position of the shifted wafer needs to be corrected before a next processing step can be performed, reducing production efficiency.

In the apparatus and the method for transferring a wafer, and the apparatus for controlling transferring a wafer provided in the embodiments of the present disclosure, the first detection unit includes a first transmit end and a first receive end, the first transmit end is provided on one of the chamber door between the transfer chamber and the process chamber and the transfer unit, the first receive end is provided on the other one of the chamber door and the transfer unit, the first detection unit is set to detect a position in a wafer transfer process, and a position of the wafer is corrected in time, to effectively improve wafer transfer precision, and reduce a damage rate in the wafer transfer process.

Figure 1:
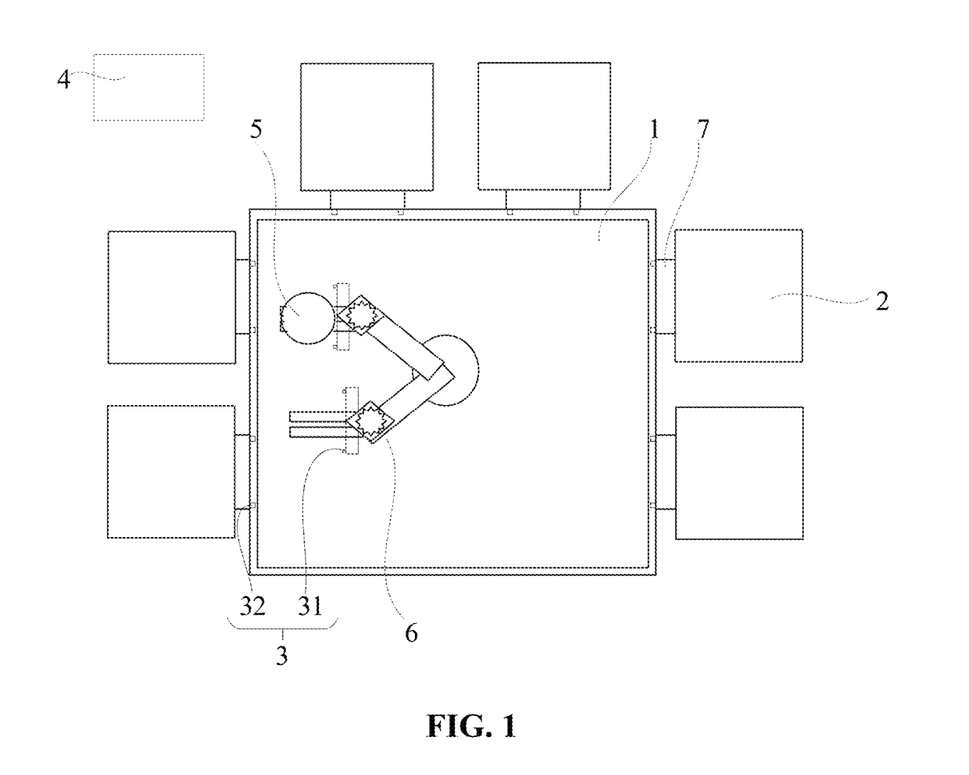
FIG. 1 is a schematic diagram of an apparatus for transferring a wafer according to an exemplary embodiment.
Figure 2:
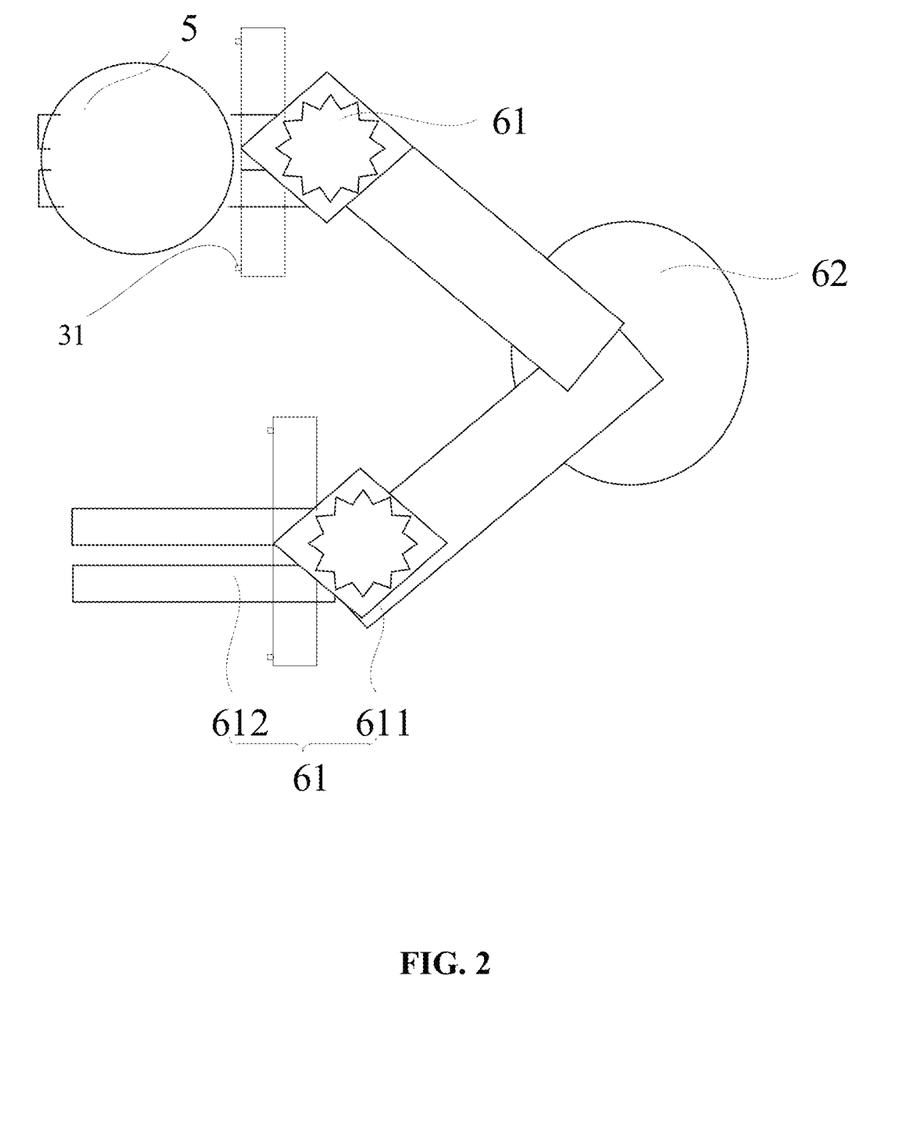
FIG. 2 is a schematic diagram of a transfer unit in an apparatus for transferring a wafer according to an exemplary embodiment.
Figure 3:
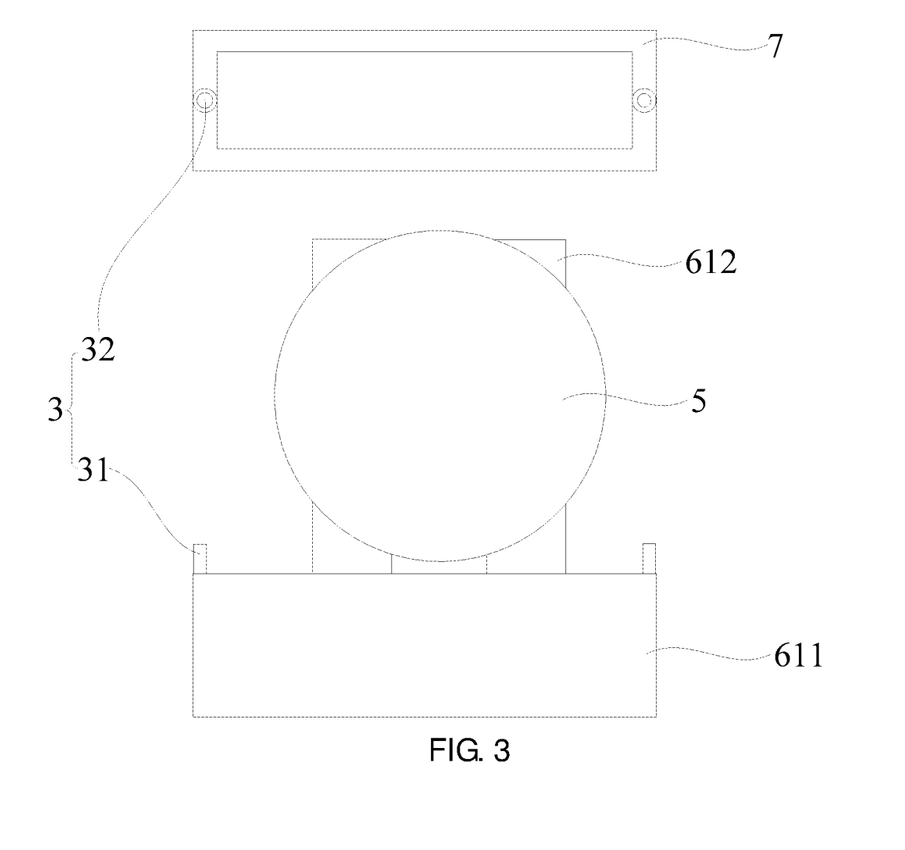
FIG. 3 is a schematic position diagram of at least one first detection unit in an apparatus for transferring a wafer according to an exemplary embodiment.
Figure 4:
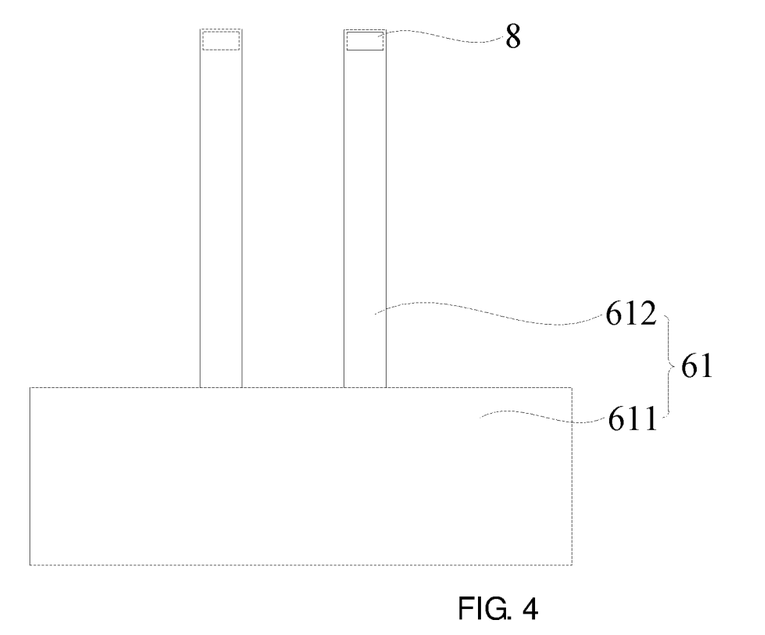
FIG. 4 is a schematic position diagram of a carrier portion and second detection units in an apparatus for transferring a wafer according to an exemplary embodiment.
Figure 5:
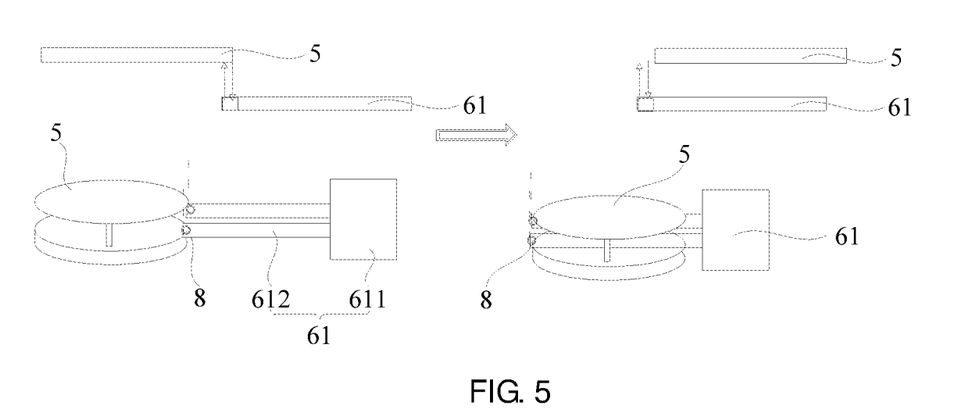
FIG. 5 is a schematic diagram of detecting a wafer center by second detection units in an apparatus for transferring a wafer according to an exemplary embodiment.

An exemplary embodiment of the present disclosure provides an apparatus for transferring a wafer. As shown in FIG. 1, FIG. 1 is a schematic diagram of an apparatus for transferring a wafer according to an exemplary embodiment of the present disclosure. FIG. 2 is a schematic diagram of a transfer unit in an apparatus for transferring a wafer. FIG. 3 is a schematic position diagram of at least one first detection unit in an apparatus for transferring a wafer. FIG. 4 is a schematic position diagram of a carrier portion and second detection units in an apparatus for transferring a wafer. FIG. 5 is a schematic diagram of detecting a wafer center by second detection units in an apparatus for transferring a wafer. The apparatus for transferring a wafer is described below with reference to FIG. 1 to FIG. 5.

As shown in FIG. 1, an exemplary embodiment of the present disclosure provides an apparatus for transferring a wafer. The apparatus for transferring a wafer includes: a transfer chamber 1, at least one process chamber 2, a first detection unit 3, and a control unit 4.

The process chamber 2 usually works in a vacuum state. A wafer is in a normal atmospheric pressure environment before and after processing. The wafer first enters the transfer chamber 1 before entering the process chamber 2. The transfer chamber 1 is used as an intermediate transition channel between the normal atmospheric pressure environment and the vacuum state and is configured to temporarily place a wafer 5 to be transferred. The transfer chamber 1 is provided therein with a transfer unit 6. The transfer unit 6 is configured to transfer the wafer 5 between the transfer chamber 1 and the process chamber 2.

In some embodiments, the transfer unit 6 may include a mechanical arm. When the transfer chamber 1 corresponds to different quantities of process chambers, a single-arm manipulator or a double-arm manipulator may be used. For example, when one transfer chamber 1 corresponds to one or two process chambers, the transfer unit 6 may be a single-arm manipulator. When two or more process chambers are provided at a periphery of one transfer chamber 1, the transfer unit may be a double-arm manipulator, to improve wafer transfer efficiency and production efficiency. In this embodiment of the present disclosure, the transfer unit 6 is a double-arm manipulator.

For example, at least one process chamber 2 is provided at a periphery of the transfer chamber 1. The at least one process chamber 2 is configured to complete different process processing processes of the wafer 5 in a production process.

The process chamber 2 is in connect with the transfer chamber 1, such that the transfer unit 6 transfers the wafer 5 between the process chamber 2 and the transfer chamber 1. A chamber door 7 is provided at a connect position between the process chamber 2 and the transfer chamber 1. The chamber door 7 is configured to be closed after the wafer completely enters the process chamber 2 or the transfer chamber 1, such that the process chamber 2 or the transfer chamber 1 is in a closed state. In addition, the opening and closing of the chamber door 7 may be automatically controlled by using a program or may be manually controlled.

To improve wafer transfer precision and reduce a wafer damage rate in a transfer process, a first detection unit 3 is provided in the apparatus for transferring a wafer. The first detection unit 3 is configured to detect position information between the transfer unit 6 and the chamber door 7. The position information is used to represent: when the transfer unit 6 grabs an end portion of the wafer 5 and the wafer 5 enters the process chamber 2, whether the end portion of the wafer 5 corresponds to the chamber door 7. When the end portion of the wafer 5 corresponds to the chamber door 7, the chamber door 7 is opened. In this case, the transfer unit 6 grabs the wafer 5 from the process chamber 2 and transfers the wafer 5 into the transfer chamber 1; or the transfer unit 6 transfers the wafer 5 from the transfer chamber 1 into the process chamber 2.

Referring to FIG. 3, the first detection unit 3 includes a first transmit end 31 and a first receive end 32. The first transmit end 31 is provided on one of the transfer unit 6 and the chamber door 7, and the first receive end 32 is provided on the other one of the transfer unit 6 and the chamber door 7. That is, when the first transmit end 31 is provided on the transfer unit 6, the first receive end 32 is provided on the chamber door 7; or when the first transmit end 31 is provided on the chamber door 7, the first receive end 32 is provided on the transfer unit 6.

In this embodiment, the first transmit end 31 includes an infrared emitter, and the first receive end 32 includes an infrared receiver. There are two first detection units 3. Two first transmit ends 31 are symmetrically provided on the transfer unit 6, and the two first transmit ends 31 are arranged on two sides of the wafer 5. Two first receive ends 32 are symmetrically provided on the chamber door 7 and are configured to position a center point of the transfer unit 6. The two first transmit ends 31 are provided one-to-one corresponding to the two first receive ends 32, that is, one first transmit end 31 corresponds to one first receive end 32. In addition, in a rotation process of the transfer unit 6, the chamber door 7 can be opened only when the two first receive ends 32 simultaneously receive emitted signals emitted by the two first transmit ends 31. In this case, the transfer unit 6 transfers the wafer 5 into the process chamber 2, or the transfer unit 6 takes out the wafer 5 from the process chamber 2, to effectively reduce an occurrence probability that a damage status occurs because the wafer touches the chamber door during a transfer process. Certainly, it may be resolved that quantities of first transmit ends 31 and first receive ends 32 are not specifically limited in the present disclosure. For example, the quantities of first transmit ends 31 and first receive ends 32 may each be one. For another example, the quantities of first transmit ends 31 and first receive ends 32 are each three, and the first transmit ends 31 are provided one-to-one corresponding to the first receive ends 32.

In some possible embodiments, the apparatus for transferring a wafer further includes a control unit 4, and the control unit 4 is electrically connected to the first detection unit 3, the transfer unit 6, and the chamber door 7 separately. The control unit 4 is configured to determine the position information between the transfer unit 6 and the chamber door 7, control the transfer unit 6 to move based on the position information, and control the chamber door 7 to open or close.

In this embodiment, the first transmit end is provided on one of the chamber door between the transfer chamber and the process chamber and the transfer unit, and the first receive end is provided on the other one of the chamber door and the transfer unit, such that when the first transmit end completely corresponds to the first receive end, the control unit controls the chamber door to open. The first detection unit is set to detect a position in a wafer transfer process, to correct a position of the wafer, so as to effectively improve wafer transfer precision, and reduce a damage rate in the wafer transfer process.

In some embodiments, as shown in FIG. 2, the transfer unit 6 includes a carrier portion 61 configured to carry the wafer 5 and a transfer component 62.

Referring to FIG. 2 and FIG. 4, the transfer component 62 is connected to the carrier portion 61 and is configured to drive the carrier portion 61 to move between the transfer chamber 1 and the process chamber 2. The transfer component 62 may include a base, a lifting structure provided on the base, a moving structure connected to the lifting structure, and a rotation structure connected to the moving structure, where the rotation structure is rotatably connected to the carrier portion 61. The lifting structure is configured to drive the moving structure to move in a vertical direction, the moving structure is configured to drive the rotation structure to move in a horizontal direction, and the carrier portion 61 can move in the horizontal direction together with the rotation structure. In addition, the carrier portion 61 can rotate relative to the rotation structure.

Referring to FIG. 2 and FIG. 3, the carrier portion 61 includes a carrier body 611 and a plurality of carrying rods 612 provided at intervals on the carrier body 611. The plurality of carrying rods 612 are provided side by side and at intervals, and the plurality of carrying rods 612 constitute a carrying region used to carry the wafer 5. In this embodiment, two first transmit ends 31 are provided on the carrier body 611, the two first transmit ends 31 are respectively provided on two sides of the carrying region, and the two first transmit ends 31 are symmetrically provided.

In order to support the weight of the first transmit end 31 and the wafer 5, and to prevent the transfer unit 6 from shaking in a movement process, in some embodiments, the transfer component 62 is made of a carbon fiber material to strengthen structural strength of the transfer component 62. However, the carrier body 611 and the plurality of carrying rods 612 use a ceramic material, for example, a ceramic material such as $Al_2O_3$ or SiC. Such type of ceramic material has high mechanical strength and good wear resistance, reducing the wear on the wafer. The carrier body and the plurality of carrying rods made by using the ceramic material have good wear resistance. Therefore, it is less likely to generate wear waste during a wafer contact process. This resolves a problem that wear waste scratches a surface of the wafer, and further prolongs a service life of the carrier portion.

According to an exemplary embodiment, as shown in FIG. 4 and FIG. 5, the apparatus for transferring a wafer in the embodiments of the present disclosure further includes second detection units 8 electrically connected to the control unit 4, and the second detection unit 8 is provided on an end portion of the carrying rod 612 far away from the carrier body 611.

The second detection unit 8 includes an infrared emission sensor. The infrared emission sensor has a light source transmit end and a light source receive end. The light source transmit end and the light source receive end are each provided on the end portion of the carrying rod 612. The light source transmit end is configured to emit a sense signal. When the sense signal is blocked by the wafer 5, the sense signal is reflected and received by the light source receive end. According to the intensity of infrared reflection, an actual position of an edge position of the wafer is sensed.

There are a plurality of second detection units 8 and the plurality of second detection units 8 are provided one-to-one corresponding to end portions of a plurality of carrying rods 612. That is, one second detection unit 8 is provided on one carrying rod 612. When the second detection unit 8 uses the infrared emission sensor, the light source transmit end and the light source receive end of the infrared emission sensor are each provided on the end portion of the carrying rod 612. In an embodiment, quantities of second detection units 8 and carrying rods 612 are each two. In an actual operation, referring to FIG. 5, end portions of two carrying rods 612 move relative to the wafer 5, and when the end portions move to a right side of the wafer 5, two infrared emission sensors detect two edge position detection points on the right side of the wafer 5. The carrying rods 612 continue to move to a left side of the wafer 5, and when the end portions of the carrying rods 612 move to the left side of the wafer 5, the two infrared emission sensors detect two edge position detection points on the left side of the wafer 5. The four edge position detection points of the wafer 5 are used to determine a central position of the wafer 5. That is, when there is a displacement shift after process processing is performed on the wafer 5 in the process chamber 2, the central position of the wafer 5 is re-determined by the second detection units 8, and then the control unit 4 adjusts and accurately controls the transfer unit 6 to grab the central position of wafer 5.

In this embodiment, one second detection unit is installed on an end portion of each carrying rod, to complete position correction of the wafer shift before the wafer is grabbed, such that the transfer unit accurately grabs the central position of the wafer. This effectively avoids an alarm of a machine platform caused by the wafer shift, and improves production efficiency.

Figure 6:
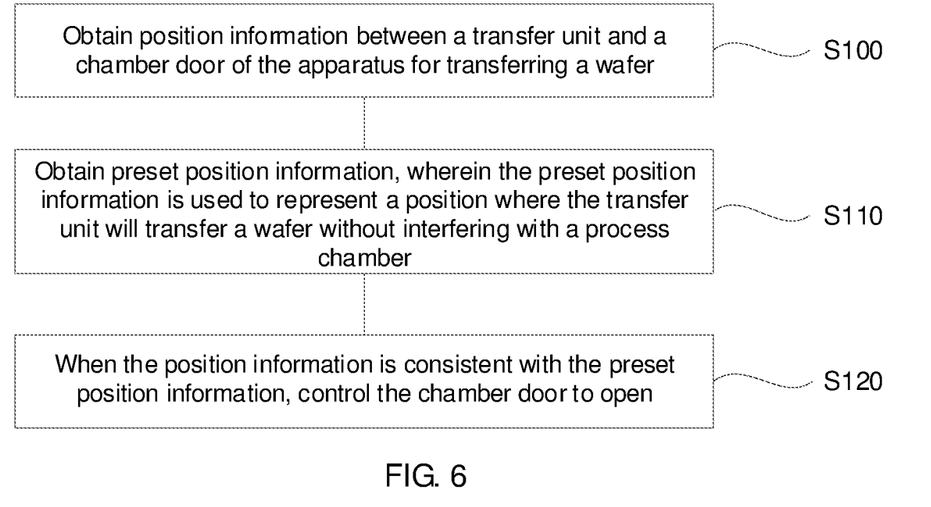
FIG. 6 is a schematic flowchart of a method for transferring a wafer according to an exemplary embodiment.

As shown in FIG. 6, an exemplary embodiment of the present disclosure provides a method for transferring of an apparatus for transferring a wafer, applied in a process of transferring a wafer 5 between a process chamber 2 and a transfer chamber 1 by the apparatus for transferring a wafer. The method for transferring a wafer in this embodiment includes:

Step S100: Obtain position information between a transfer unit and a chamber door of the apparatus for transferring a wafer.

Step S110: Obtain preset position information, wherein the preset position information is used to represent a position where the transfer unit will transfer a wafer without interfering with a process chamber.

Step S120: When the position information is consistent with the preset position information, control the chamber door to open.

In step S100, with reference to the FIG. 1 to FIG. 5, first, a control unit 4 obtains first transmit information emitted by a first transmit end 31 in a first detection unit 3, then the control unit 4 obtains first receive information received by a first receive end 32 matching the first transmit end 31, and afterwards the control unit 4 determines the position information between the transfer unit 6 and the chamber door 7 according to the first transmit information and the first receive information.

In step S110, the preset position information of the wafer 5 is obtained, where the preset position information is used to represent a position where the transfer unit 6 will transfer the wafer 5 without interfering with the process chamber 2. The preset position information may be prestored in the control unit 4, or may be prestored in another storage apparatus or a cloud platform. When the control unit 4 needs to use the preset position information, the control unit 4 obtains the preset position information by being communicatively connected to the storage apparatus or the cloud platform.

In step S120, the control unit 4 compares the position information with the preset position information. When the position information is consistent with the preset position information, the control unit 4 controls the chamber door 7 to open, such that the transfer unit 6 drives the wafer 5 into the process chamber 2, or transfers the wafer 5 from the process chamber 2 into the transfer chamber 1. Herein, the preset position information in this embodiment may be a value range. In this case, that the position information is consistent with the preset position information may be understood as that, when a value difference between the position information and the preset position information is within a preset range, the position information is consistent with the preset position information.

In this embodiment, whether first receive information received by a plurality of first receive ends 32 matches first transmit information emitted by a plurality of first transmit ends 31 matching the plurality of first receive ends 32 is first determined. When determining that the foregoing information matches each other, the control unit 4 determines that the position information matches the preset position information. In an embodiment, there are two first detection units 3, and the two first transmit ends 31 are symmetrically provided on two sides of the transfer unit 6. Two first receive ends 32 are arranged and symmetrically provided on two sides of the chamber door 7. The two first transmit ends 31 are provided one-to-one corresponding to the two first receive ends 32. In an actual operation, the transfer unit 6 can perform a next step of action only after the two first receive ends 32 simultaneously receive emitted signals of the two first transmit ends 31, for example, the transfer unit 6 drives the wafer 5 to transfer from the transfer chamber 1 into the process chamber 2, or the transfer unit 6 grabs the wafer 5 from the process chamber 2 and transfers the wafer 5 into the transfer chamber 1.

According to an exemplary embodiment, after step S120, the method for transferring a wafer further includes:

Step S200: Obtain process information.

Step S210: According to the process information, control the transfer unit to transfer the wafer into the process chamber, or control the transfer unit to grab the wafer from the process chamber.

For example, in step S200, the process information is used to represent processing information of different process processing in a production process of the wafer 5. When obtaining different process information, the control unit 4 needs to send the wafer 5 into different process chambers 2 for process processing.

For example, in step S210, for different processes of a production process, if process processing is to be performed on the wafer, the transfer unit is controlled to transfer the wafer into the process chamber. If process processing is completed on the wafer, the transfer unit is controlled to grab the wafer from the process chamber, to facilitate subsequent process processing.

According to an exemplary embodiment, after step S300, before the obtaining the process information, the method for transferring a wafer further includes:

Step S300: Obtain preset posture information of the wafer in the process chamber, where the preset posture information is used to represent a preset position.

Step S310: Obtain current position information of the wafer.

Step S320: Compare the current position information with the preset posture information, to determine a shift status of the wafer based on a comparison result.

For example, in step S300, the preset posture information may be prestored in the control unit, that is, information that the wafer is at a correct production position in the process chamber. When the wafer is at the preset position, the transfer unit may directly grab the wafer.

For example, in step S310, after process processing is performed on the wafer in the process chamber, due to different clamping forces of a clamping tool clamping the wafer in the process chamber or the airflow, pressure, and another reason of a processing gas in the process, a relative position of the wafer may be shifted after the process processing. In this case, a detection apparatus may be provided in the process chamber, to obtain the current position information of the wafer after the process processing.

For example, in step S320, the control unit 4 compares the current position information with the preset posture information, to determine a shift status of the wafer 5 based on a comparison result.

In this step, if the control unit 4 determines that the comparison result indicates that the current position information is consistent with the preset posture information, it is determined that the wafer does not shift. In this case, the control unit 4 controls the transfer unit 6 to enter the process chamber 2 to grab the wafer 5.

If the control unit 4 determines that the comparison result indicates that the current position information is inconsistent with the preset posture information, it is determined that the wafer shifts, and the control unit 4 controls the transfer unit 6 to perform an adjustment operation.

The adjustment operation includes: determining a center of the wafer, and determining adjustment information according to the center of the wafer determined; and then controlling the transfer unit to perform the adjustment operation according to the adjustment information.

In a process of determining the center of the wafer, that is, in a process of grabbing the wafer 5 by the transfer unit 6, detection information of the second detection units 8 is obtained; and the center of the wafer is determined according to the detection information.

The second detection unit 8 includes an infrared emission sensor. The infrared emission sensor has a light source transmit end and a light source receive end. The light source transmit end and the light source receive end are each provided on the end portion of the carrying rod 612. The light source transmit end is configured to emit a sense signal. When the sense signal is blocked by the wafer 5, the sense signal is reflected and received by the light source receive end. According to the intensity of infrared reflection, an actual position of an edge position of the wafer is sensed.

There are a plurality of second detection units 8 and the plurality of second detection units 8 are provided one-to-one corresponding to end portions of a plurality of carrying rods 612. That is, one second detection unit 8 is provided on one carrying rod 612. When the second detection unit 8 uses the infrared emission sensor, the light source transmit end and the light source receive end of the infrared emission sensor are each provided on the end portion of the carrying rod 612. In an embodiment, quantities of second detection units 8 and carrying rods 612 are each two. In an actual operation, referring to FIG. 5, end portions of two carrying rods 612 move relative to the wafer 5, and when the end portions move to a right side of the wafer 5, two infrared emission sensors detect two edge position detection points on the right side of the wafer 5. The carrying rods 612 continue to move to a left side of the wafer 5, and when the end portions of the carrying rods 612 move to the left side of the wafer 5, the two infrared emission sensors detect two edge position detection points on the left side of the wafer 5. The four edge position detection points of the wafer 5 are used to determine a central position of the wafer 5. That is, when there is a displacement shift after process processing is performed on the wafer 5 in the process chamber 2, the central position of the wafer 5 is re-determined by the second detection units 8, and then the control unit 4 adjusts and accurately controls the transfer unit 6 to grab the central position of wafer 5.

In this embodiment, the method for transferring of the apparatus for transferring a wafer of this embodiment is simple to operate, can effectively improve accuracy of transferring the wafer between the process chamber and the transfer chamber, reduce a damage rate in the wafer transfer process, and can effectively improve wafer production efficiency.

Figure 7:
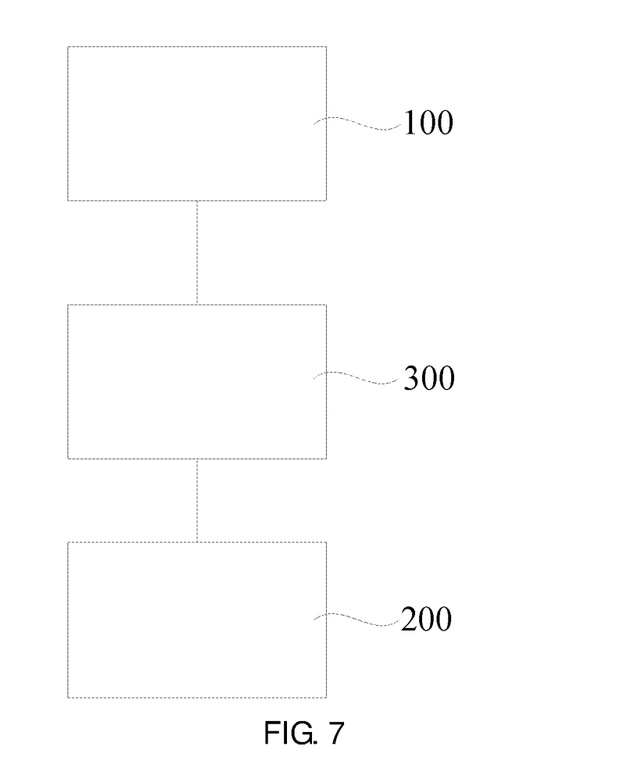
FIG. 7 is a schematic diagram of an apparatus for controlling transferring a wafer according to an exemplary embodiment.

As shown in FIG. 7, an exemplary embodiment of the present disclosure provides an apparatus for controlling transferring a wafer, used in a process of transferring a wafer 5 between a process chamber 2 and a transfer chamber 1 by an apparatus for transferring a wafer. The control apparatus includes: an obtaining module 100, a processing module 200, and a control module 300, where the control module 30 is electrically connected to the obtaining module 100 and the processing module 200 separately.

For example, the obtaining module 100 is configured to obtain position information between a transfer unit and a chamber door, and is further configured to obtain preset position information, where the preset position information is used to represent a position where the transfer unit will transfer the wafer without interfering with the process chamber.

For example, the processing module 200 is configured to determine whether the position information is consistent with the preset position information.

For example, the control module 300 is configured to control the chamber door to open when the position information is consistent with the preset position information.

The apparatus for controlling transferring a wafer in this embodiment has a simple structure design and is easy to operate. In a use process, accuracy of transferring the wafer between the process chamber and the transfer chamber can be effectively improved, and a damage rate in the wafer transfer process can be reduced. In addition, wafer production efficiency can be effectively improved.

The embodiments or implementations of this specification are described in a progressive manner, and each embodiment focuses on differences from other embodiments. The same or similar parts between the embodiments may refer to each other.

In the description of the specification, the description with reference to terms such as "an embodiment", "an exemplary embodiment", "some implementations", "a schematic implementation" and "an example" means that the specific feature, structure, material, or characteristic described in combination with the implementation(s) or example(s) is included in at least one implementation or example of the present disclosure.

In this specification, the schematic expression of the above terms does not necessarily refer to the same implementation or example. Moreover, the described specific feature, structure, material, or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the accompanying drawings. These terms are merely intended to facilitate description of the present disclosure and simplify the description, rather than to indicate or imply that the mentioned apparatus or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more accompanying drawings are denoted by similar reference numerals. For the sake of clarity, various parts in the accompanying drawings are not drawn to scale. In addition, some well-known parts may not be shown. For the sake of brevity, the structure obtained by implementing a plurality of steps may be shown in one figure. In order to make the understanding of the present disclosure more clearly, many specific details of the present disclosure, such as the structure, material, size, processing process, and technology of the device, are described below. However, as those skilled in the art can understand, the present disclosure may not be implemented according to these specific details.

Finally, it should be noted that the foregoing embodiments are used only to explain the technical solutions of the present disclosure, but are not intended to limit the present disclosure. Although the present disclosure has been described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the spirit and scope of the technical solutions of the embodiments of the present disclosure.

INDUSTRIAL APPLICABILITY

In the apparatus and the method for transferring a wafer, and the apparatus for controlling transferring a wafer provided in the embodiments of the present disclosure, the first detection unit is provided on the chamber door between the transfer chamber and the process chamber and on the transfer unit, such that wafer transfer precision and transfer efficiency are effectively improved, and a damage rate in the wafer transfer process is reduced.

The invention claimed is:

1. A method for transferring a wafer, applied in a process of transferring a wafer between a process chamber and a transfer chamber by an apparatus for transferring a wafer, comprising:

obtaining position information between a transfer unit and a chamber door of the apparatus for transferring a wafer;

obtaining preset position information, the preset position information being used to represent a position where the transfer unit will transfer the wafer without interfering with the process chamber; and controlling the chamber door to open when the position information is consistent with the preset position information;

after the controlling the chamber door to open, the method for transferring a wafer further comprises:

obtaining a preset posture information of the wafer in the process chamber, the preset posture information being used to represent a preset position;

obtaining current position information of the wafer; and comparing the current position information with the preset posture information, to determine a shift status of the wafer based on a comparison result;

wherein the comparing the current position information with the preset posture information, to determine a shift status of the wafer based on a comparison result comprises:

when the comparison result indicates that the current position information is consistent with the preset posture information, determining that the wafer does not shift, such that the transfer unit grabs the wafer; or when the comparison result indicates that the current position information is inconsistent with the preset posture information, determining that the wafer shifts and controlling the transfer unit to perform an adjustment operation.

2. The method for transferring a wafer according to claim 1, after the controlling the chamber door to open, the method for transferring a wafer further comprises:

obtaining process information; and controlling the transfer unit to transfer the wafer into the process chamber or controlling the transfer unit to grab the wafer from the process chamber according to the process information.

3. The method for transferring a wafer according to claim 1, wherein the obtaining position information between a transfer unit and a chamber door of the apparatus for transferring a wafer comprises:

obtaining first transmit information emitted by a first transmit end of a first detection unit;

obtaining first receive information received by a first receive end of the first detection unit and matching the first transmit end; and determining the position information between the transfer unit and the chamber door of the apparatus for transferring a wafer according to the first transmit information and the first receive information.

4. The method for transferring a wafer according to claim 3, wherein a method of determining that the position information is consistent with the preset position information comprises:

determining whether first receive information received by a plurality of the first receive ends matches first transmit information emitted by a plurality of the first transmit ends matching the plurality of the first receive ends; and when the first receive information received by a plurality of the first receive ends matches the first transmit information emitted by a plurality of the first transmit ends matching the plurality of the first receive ends, determining that the position information is consistent with the preset position information.

5. The method for transferring a wafer according to claim 1, wherein the determining that the wafer shifts, and controlling the transfer unit to perform an adjustment operation comprises:
- determining a center of the wafer, and determining adjustment information according to the center of the wafer determined; and
- controlling the transfer unit to perform the adjustment operation according to the adjustment information.

6. The method for transferring a wafer according to claim 5, wherein the determining a center of the wafer comprises:
- obtaining detection information of second detection units in a process of grabbing the wafer by the transfer unit; and
- determining the center of the wafer according to the detection information.

* * * * *